(12) United States Patent
Chen et al.

(10) Patent No.: US 12,150,275 B2
(45) Date of Patent: Nov. 19, 2024

(54) IMMERSION COOLING SYSTEM AND COOLING METHOD THEREOF

(71) Applicant: Delta Electronics, Inc., Taoyuan (TW)

(72) Inventors: Li-Hsiu Chen, Taoyuan (TW);
Ming-Tang Yang, Taoyuan (TW);
Wei-Chih Lin, Taoyuan (TW);
Peng-Yuan Chen, Taoyuan (TW);
Sheng-Chi Wu, Taoyuan (TW);
Ren-Chun Chang, Taoyuan (TW);
Wen-Yin Tsai, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 222 days.

(21) Appl. No.: 17/883,197

(22) Filed: Aug. 8, 2022

(65) Prior Publication Data

US 2023/0389231 A1     Nov. 30, 2023

(30) Foreign Application Priority Data

May 24, 2022   (CN) .......................... 202210574852.6

(51) Int. Cl.
*H05K 7/20*     (2006.01)

(52) U.S. Cl.
CPC ......... *H05K 7/203* (2013.01); *H05K 7/20318* (2013.01); *H05K 7/20327* (2013.01); *H05K 7/20818* (2013.01)

(58) Field of Classification Search
CPC .......... H05K 7/20236; H05K 7/20254; H05K 7/20263; H05K 7/20272; H05K 7/203;

(Continued)

(56) References Cited

U.S. PATENT DOCUMENTS 9,812,243 B2    11/2017 White et al.
2002/0135981 A1*  9/2002 Pautsch .............. H05K 7/20345
                                                          257/714

(Continued)

FOREIGN PATENT DOCUMENTS

CN       103931279 B      8/2016
CN       110456893 A     11/2019

(Continued)

OTHER PUBLICATIONS

CN-113093890-A English Translation (Year: 2021).*
CN-212367777-U English Translation (Year: 2021).*

*Primary Examiner* — Amir A Jalali
(74) *Attorney, Agent, or Firm* — KIRTON McCONKIE; Evan R. Witt

(57) ABSTRACT

The present disclosure provides an immersion cooling system for a server cabinet including a plurality of server boxes, a cooling tank and a plurality of liquid connecting pipes. Each server box includes an electronic device immersed in the cooling liquid, and the electronic device generates a thermal energy so that part of the cooling liquid evaporates into a hot vapor. The cooling tank is connected to the plurality of server boxes and includes a condenser and a storage part. The condenser is connected to each server box and condenses the hot vapor to form the cooling liquid. The storage part storages the cooling liquid from the condenser. Two ends of the liquid connecting pipe is connected to the storage part and the server box respectively. The cooling liquid in the storage part and the cooling liquid of each server box are maintained in a same liquid level.

10 Claims, 4 Drawing Sheets

(58) Field of Classification Search
CPC .......... H05K 7/20318; H05K 7/20327; H05K 7/20336; H05K 7/20381; H05K 7/20418; H05K 7/20445; H05K 7/20772; H05K 7/208; H05K 7/20809; H05K 7/20818; H05K 7/20836; H05K 7/20872–20881; H05K 7/20927–20936; H05K 5/00; H05K 5/061; H01L 23/34; H01L 23/44; H01L 23/427; H01L 23/46; H01L 23/473; H03L 1/04

See application file for complete search history.

(56) References Cited

U.S. PATENT DOCUMENTS

| | | | |
|---|---|---|---|
| 2003/0010477 A1* | 1/2003 | Khrustalev | F28D 15/0266 312/236 |
| 2005/0173097 A1* | 8/2005 | Kitajima | F28D 15/00 62/118 |
| 2014/0165638 A1* | 6/2014 | Yoshikawa | H05K 7/20318 62/513 |
| 2015/0062806 A1* | 3/2015 | Shelnutt | H05K 7/20318 361/679.53 |
| 2015/0070846 A1 | 3/2015 | Shelnutt et al. | |
| 2018/0020570 A1 | 1/2018 | Fujiwara et al. | |
| 2019/0159360 A1* | 5/2019 | Uchida | H05K 7/20327 |
| 2020/0158443 A1* | 5/2020 | Tung | H05K 7/20327 |
| 2022/0256744 A1* | 8/2022 | Le | H05K 7/20318 |
| 2022/0361358 A1* | 11/2022 | Li | H05K 7/20818 |
| 2023/0023554 A1* | 1/2023 | Jian | H05K 7/20327 |
| 2023/0026658 A1* | 1/2023 | Lin | H05K 7/20318 |
| 2023/0059446 A1* | 2/2023 | Gao | H05K 7/208 |
| 2023/0209781 A1* | 6/2023 | Gao | H05K 7/20272 700/281 |
| 2023/0403821 A1* | 12/2023 | Oruganti | H05K 7/203 |

FOREIGN PATENT DOCUMENTS

| | | | |
|---|---|---|---|
| CN | 108141991 B | | 11/2020 |
| CN | 212367777 U | * | 1/2021 |
| CN | 113093890 A | * | 7/2021 |
| TW | M619768 U | | 11/2021 |

* cited by examiner

IMMERSION COOLING SYSTEM AND COOLING METHOD THEREOF

CROSS-REFERENCE TO RELATED APPLICATION

This application claims priority to China Patent Application No. 202210574852.6, filed on May 24, 2022, the entire contents of which are incorporated herein by reference for all purposes.

FIELD OF THE INVENTION

The present disclosure relates to a cooling system and a cooling method thereof, and more particularly to an immersion cooling system and a cooling method thereof.

BACKGROUND OF THE INVENTION

With the rapid development of 5th Generation mobile networks (5G), artificial intelligence, metaverse and other technologies that require high-speed computing, the requirements for heat dissipation of electronic components are getting higher. In addition, the consumed energy during the heat dissipation process is also emphasized.

One of the conventional ways to dissipate heat from the electronic components is to utilize the high-speed rotation of the fan to generate air convection, so as to remove the heat energy generated by the electronic components. However, the heat dissipation method that utilizes air convection to remove hot air cannot save energy, and also creates huge sound pollution. On the other hand, if the electronic components are immersed in the cooling liquid for cooling, the cooling liquid is evaporated into vapor so as to remove the heat energy generated by the electronic components, then the vapor will be condensed back to the cooling liquid according to the condensation technology. Under such circumstance, a water pump or valve should be added to control the liquid flow between the condensed cooling liquid and the cooling liquid soaking electronic components.

Therefore, there is a need of providing an immersion cooling system and a cooling method thereof to obviate the drawbacks encountered from the prior arts.

SUMMARY OF THE INVENTION

It is an objective of the present disclosure to provide an immersion cooling system and a cooling method thereof. The cooling liquid in the server box and the cooling liquid in the storage part are merged together through the liquid connecting pipe to maintain the same liquid level. Thereby, the cooling liquid condensed in the storage part can naturally flow back to the server box, and no water pump or valve should be added for controlling the flow of the cooling liquid.

In accordance with an aspect of the present disclosure, an immersion cooling system for a server cabinet is provided. The immersion cooling system includes a plurality of server boxes, a cooling tank and a plurality of liquid connecting pipes. Each of the plurality of server boxes has a cooling liquid, and each of the plurality of server boxes includes an electronic device immersed in the cooling liquid, the electronic device of at least one of the plurality of server boxes generates a thermal energy during the operation of the electronic device so that a part of the cooling liquid evaporates into a hot vapor. The cooling tank is connected to the plurality of server boxes and includes a condenser and a storage part. The condenser is connected to a vent hole of each of the plurality of server boxes, wherein the condenser condenses the hot vapor from the server box to form the cooling liquid. The storage part is connected to the condenser, wherein the storage part storages the cooling liquid from the condenser. A first end of each of the plurality of liquid connecting pipes is connected to a bottom portion of the storage part, and a second end of each of the plurality of liquid connecting pipes is connected to a bottom portion of the corresponding server box. The cooling liquid in the storage part flows into each of the plurality of server boxes through each of the plurality of liquid connecting pipes. The cooling liquid in the storage part and the cooling liquid in each of the plurality of server boxes are maintained in a same liquid level.

In accordance with an aspect of the present disclosure, a cooling method of the immersion cooling system is provided. The cooling method of the immersion cooling system includes steps of: providing a cooling liquid, a plurality of server boxes, a cooling tank and a plurality of liquid connecting pipes, wherein a part of the cooling liquid is contained in the plurality of server boxes, and the other part of the cooling liquid is contained in the cooling tank, the cooling tank is connected to the plurality of server boxes and the plurality of liquid connecting pipes; immersing a plurality of electronic devices in the cooling liquid in the corresponding server boxes, wherein each of the plurality of server boxes further includes a vapor space disposed above the cooling liquid, and the vapor space of each of the plurality of server boxes is connected to the cooling tank; operating the electronic device of at least one of the plurality of server boxes, wherein the electronic device of at least one of the plurality of server boxes generates a thermal energy during operation, which causes a part of the cooling liquid evaporates into hot vapor, and the hot vapor flows into the vapor space; utilizing a condenser of the cooling tank to condense the hot vapor from the server box to form the cooling liquid, wherein the cooling liquid flows into a storage part of the cooling tank through a plurality of copper pipes of the condenser; and utilizing the plurality of liquid connecting pipes to connect a bottom portion of the storage part and a bottom portion of each of the plurality of server boxes, and the cooling liquid in the storage part flowing into each of the plurality of server boxes through each of the plurality of liquid connecting pipes, wherein the cooling liquid in the storage part and the cooling liquid in each of the plurality of server boxes are maintained a same liquid level.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
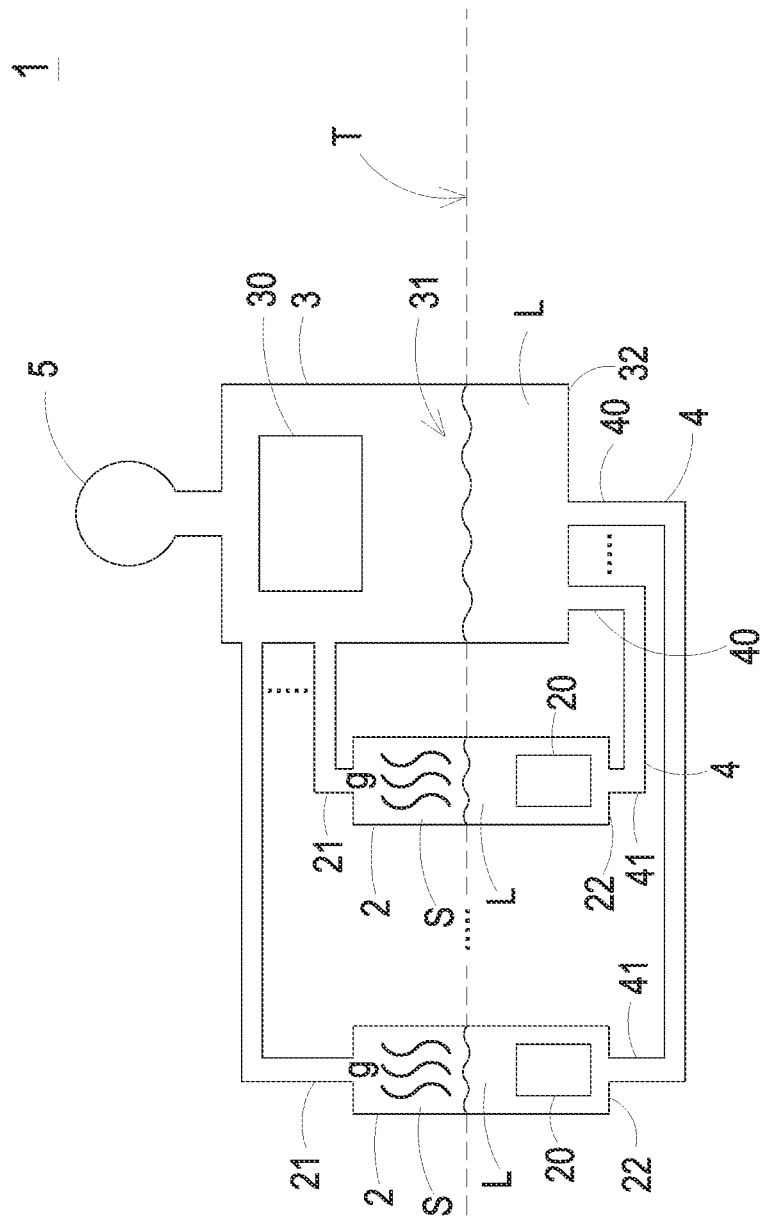
FIG. 1 is a schematic block diagram illustrating an immersion cooling system according to an embodiment of the present disclosure.

FIG. 1 is a schematic block diagram illustrating an immersion cooling system according to an embodiment of the present disclosure. As shown in FIG. 1, an immersion cooling system 1 includes a cooling liquid L, a plurality of server boxes 2, a cooling tank 3 and a plurality of liquid connecting pipes 4. A part of the cooling liquid L is contained in the plurality of server boxes 2, and the other part of the cooling liquid L is contained in the cooling tank 3. Each of the plurality of server boxes 2 includes an electronic device 20. The electronic device 20 is immersed in the cooling liquid L in the server box 2. A vapor space S is formed in each of the plurality of server boxes 2 above the cooling liquid L, and the vapor space S of each of the plurality of server boxes 2 is connected to the cooling tank 3. The electronic device 20 of at least one of the plurality of server boxes 2 generates thermal energy during operation, which causes part of the cooling liquid L evaporates into hot vapor g flowing into the vapor space S. The electronic device 20 is for example but not limited to a server. It should be noted that each server box 2 is a pressure-sealed box that avoids leakage of the hot vapor g. In an embodiment, the cooling liquid L is a non-conductive liquid with a boiling point between 50° C. and 60° C. Each server box 2 further includes a vent hole 21, the vent hole 21 is connected to the cooling tank 3 and is configured to allow the hot vapor g to flow to the cooling tank 3 through the vent hole 21. The cooling tank 3 includes a condenser 30 and a storage part 31. The condenser 30 condenses the hot vapor g from the server box 2 to form the cooling liquid L. The storage part 31 is connected to the condenser 30, and the storage part 31 storages the cooling liquid L from the condenser 30. The storage part 31 has a bottom portion 32, and each server box 2 has a bottom portion 22. Each of the liquid connecting pipes 4 has a first end 40 and a second end 41. The first end 40 of each of the liquid connecting pipe 4 is connected to the bottom portion 32 of the storage part 31. The second end 41 of each of the liquid connecting pipe 4 is connected to the bottom portion 22 of the corresponding server box 2. The bottom portion 32 of the storage part 31 is higher than the bottom portion 22 of every server box 20 relative to the ground, so the cooling liquid L in the storage part 31 flows into the server boxes 2 through the liquid connecting pipes 4. The cooling liquid L in the storage part 31 merges with the cooling liquid L in each of the plurality of server boxes 2 through the plurality of liquid connecting pipes 4 to maintain the same liquid level T. It should be noted that the liquid level T in the present disclosure is the measured level of the cooling liquid L in the server box 2 and the storage part 31, namely the liquid level T may have a measurement error range. Consequently, the cooling liquid condensed in the storage part can naturally flow back to the server box, and no water pump or valve should be added for controlling the flow of the cooling liquid.

In an embodiment, the immersion cooling system 1 further includes a pressure balancing device 5. The pressure balancing device 5 is connected to the cooling tank 3, and is configured to balance the pressure in the cooling tank 3. The pressure balancing device 5 may include an inflatable or deflated means such as a balloon or a bellow, but not limited thereto. In an embodiment, the air pressure balancing device 5 adjusts the air pressure in the cooling tank 3 through inflation or deflation of the balloon or the bellow. For example, when the rate of generating the hot vapor g by the server box 2 is too high, the condenser 30 of the cooling tank 3 cannot condense the hot vapor g in time, such that the hot vapor g is accumulated in the cooling tank 3, resulting in excessive air pressure in the cooling tank 3. Under such circumstance, in the pressure balancing device 5, the air pressure in the cooling tank 3 can be adjusted through the inflation of the balloon or the bellow, so as to prevent the cooling tank 3 from being deformed and damaged.

Figure 2:
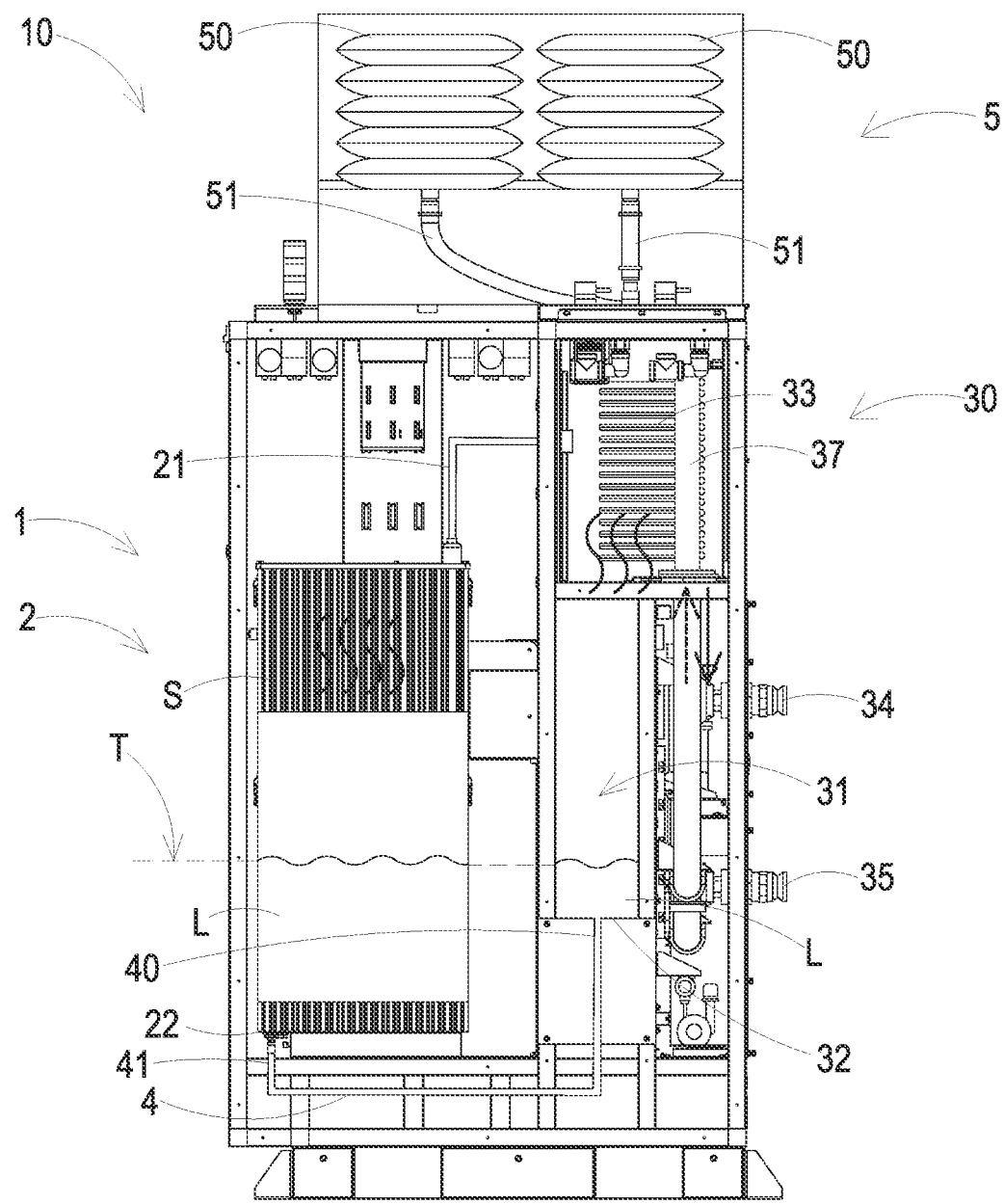
FIG. 2 is a side view illustrating an immersion cooling system used in a server cabinet according to another embodiment of the present disclosure.

In an embodiment, the immersion cooling system 1 shown in FIG. 1 can be further used in a server cabinet. As shown in FIG. 2, FIG. 2 is a side view illustrating the immersion cooling system used in a server cabinet according to another embodiment of the present disclosure. In this embodiment, the immersion cooling system 1 is used in a server cabinet 10, and the air pressure balancing device 5 of the immersion cooling system 1 includes a bellow 50 and a connecting pipe 51 connected thereto. In an embodiment, an amount of the bellow 50 is not limited to one, and an amount of the corresponding connecting pipe 51 is not limited to one, either. The connecting pipe 51 is connected to the cooling tank 3. When the air pressure in the cooling tank 3 is too high, in the air pressure balancing device 5, part of the hot vapor g in the cooling tank 3 flows into the bellow 50 through the connecting pipe 51 to be absorbed by the inflatable bellow 50, thereby adjusting the air pressure in the cooling tank 3.

Figure 3:
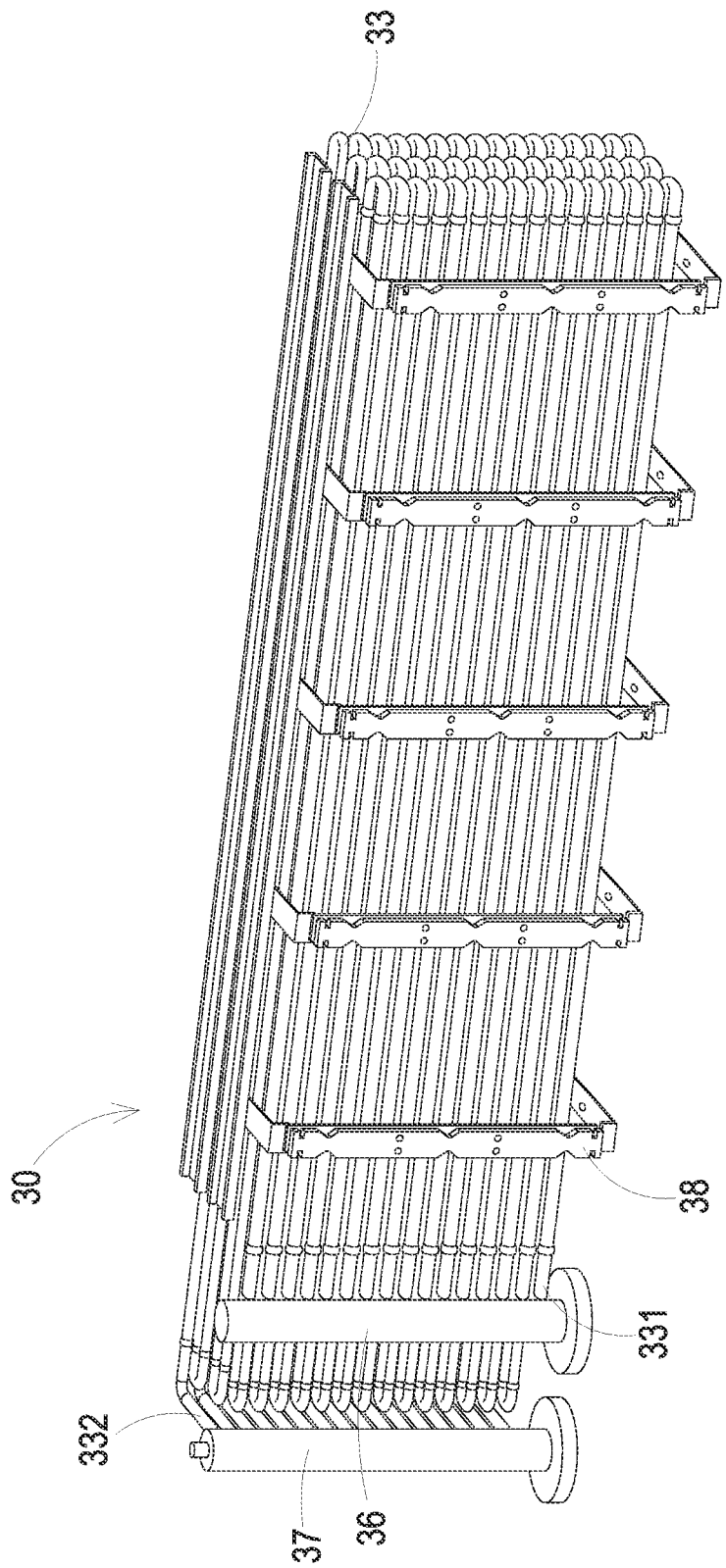
FIG. 3 is a schematic perspective view illustrating the condenser of the immersion cooling system of FIG. 2.

Please refer to FIGS. 2 and 3. FIG. 3 is a schematic perspective view illustrating the condenser of the immersion cooling system of FIG. 2. In this embodiment, the condenser 30 includes a first condensing pipe 36, a second condensing pipe 37, a plurality of copper pipes 33 which are bent and wound, a hot water output pipe 34 and a cooling water input pipe 35. The first condensing pipe 36 is connected to a first end 331 of each of the plurality of copper pipes 33. The second condensing pipe 37 is connected to a second end 332 of each of the plurality of copper pipes 33. The first condensing pipe 36 and the second condensing pipe 37 are connected to the hot water output pipe 34 and the cooling water input pipe 35, respectively. In addition, the cooling water input pipe 35 is further connected to an external cooling tower (not shown), and the cooling tower supplies cooling water (or other condensed liquid) to the condenser 30 via the cooling water input pipe 35. The cooling water is injected into the second condensing pipe 37 through the cooling water input pipe 35 (as depicted by the dashed arrow in FIG. 2). The cooling water flows into the plurality of copper pipes 33 through the second condensing pipe 37, an outer wall of the copper pipe 33 is cooled down by the flowing cooling water. Accordingly, the hot vapor g from the server box 2 condenses into the cooling liquid L when the hot vapor g contacts the outer wall of the copper pipe 33. At the same time, the heat energy lost from the hot vapor g during the condensation process is conducted inside of the copper pipe 33 to heat up the cooling water and turn it into hot water. The hot water is vented through the first condensing pipe 36 and the hot water output pipe 34 (as depicted by the solid arrow in FIG. 2). In an embodiment, the condenser 3 further includes a plurality of mounting brackets 38 connected to the plurality of copper pipes 33. The mounting bracket 38 is configured to fix the condenser 3 in the cooling tank 3.

Figure 4:
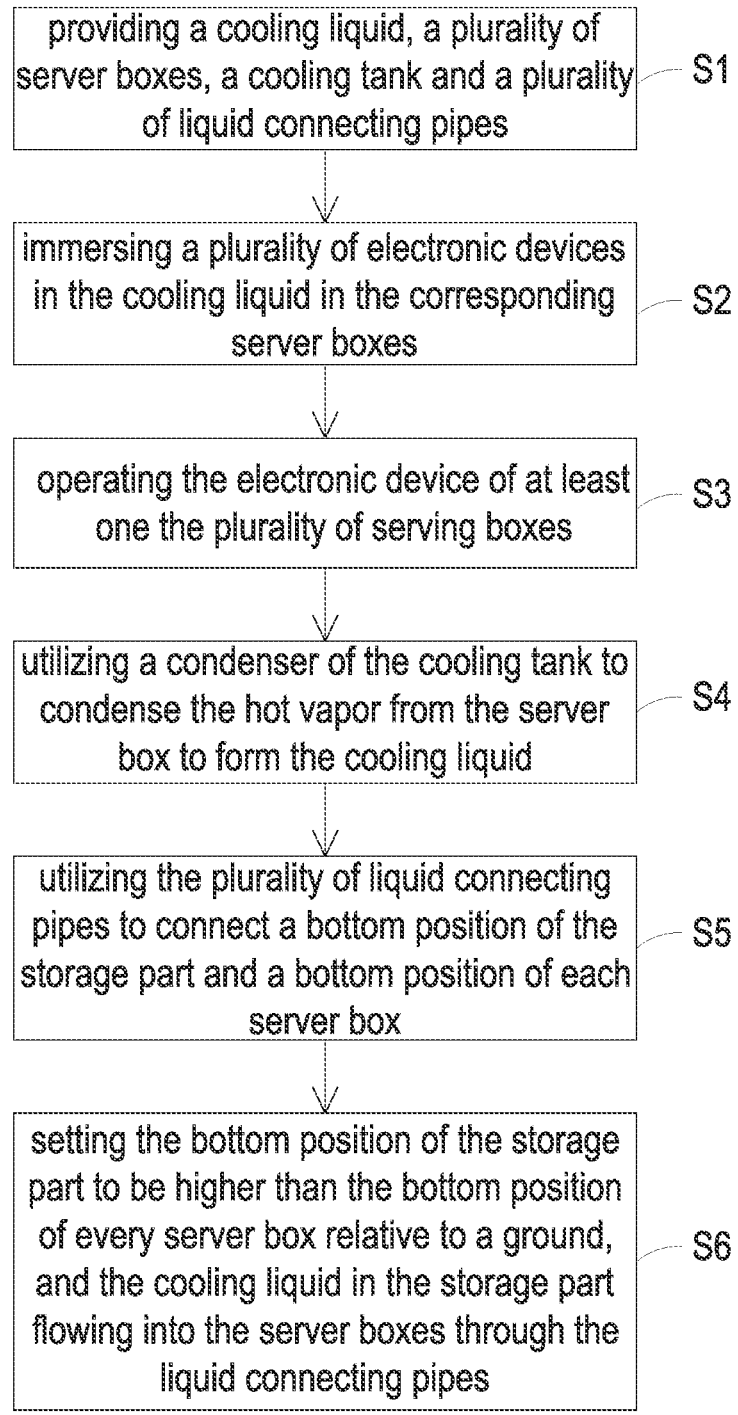
FIG. 4 is a schematic flow chart illustrating a cooling method of the immersion cooling system according to an embodiment of the present disclosure.

FIG. 4 is a schematic flow chart illustrating a cooling method of the immersion cooling system according to an embodiment of the present disclosure. The cooling method of the immersion cooling system of the present disclosure is applicable for the immersion cooling system 1 stated above. As shown in FIG. 4, the cooling method of the immersion cooling system includes steps S1, S2, S3, S4, S5 and S6. In the step S1, a cooling liquid L, a plurality of server boxes 2, a cooling tank 3 and a plurality of liquid connecting pipes 4 are provided. A part of the cooling liquid L is contained in the plurality of server boxes 2, and the other part of the cooling liquid L is contained in the cooling tank 3. The cooling tank 3 is connected to the plurality of server boxes 2 and the plurality of liquid connecting pipes 4. In the step S2, a plurality of electronic devices 20 are immersed in the cooling liquid L in the plurality of server boxes 2, respectively. A vapor space S is formed in each of the plurality of server boxes 2 above the cooling liquid L, and the vapor space S of each of the plurality of server boxes 2 is connected to the cooling tank 3. In the step S3, the electronic device 20 of at least one of the plurality of server boxes 2 is operated. The electronic device 20 of at least one of the plurality of server boxes 2 generates thermal energy during operation, which causes part of the cooling liquid L evaporates into hot vapor g flowing into the vapor space S. In the step S4, the condenser 30 of the cooling tank 3 condenses the hot vapor g from the server box 2 to form the cooling liquid L. The cooling liquid L flows into the storage part 31 of the cooling tank 3 through the plurality of copper pipes 33 of the condenser 30. In the step S5, the bottom portion 32 of the storage part 31 is connected to the bottom portion 22 of each server box 2 through the plurality of liquid connecting pipes 4. In the step S6, the bottom portion 32 of the storage part 31 is set to be higher than the bottom portion 22 of every server box 20 relative to the ground, so the cooling liquid L in the storage part 31 flows into the server boxes 2 through the liquid connecting pipes 4. The cooling liquid L in the storage part 31 merges with the cooling liquid L in each of the plurality of server boxes 2 through the plurality of liquid connecting pipes 4 to maintain the same liquid level T.

In an embodiment, the cooling method of the immersion cooling system of the present disclosure further includes a step of providing a pressure balancing device 5. The pressure balancing device 5 is connected to the cooling tank 3 and is configured to balance the pressure in the cooling tank 3.

In an embodiment, the cooling method of the immersion cooling system of the present disclosure further includes steps of: increasing an amount of the plurality of electronic devices 20 for increasing the hot vapor g being received by the condenser 30 and increasing the pressure in the cooling tank 3; and utilizing the pressure balancing device 5 connected to the cooling tank 3 to absorb the hot vapor g in the cooling tank 3 and to be inflated for maintaining the pressure in the cooling tank 3 within a constant pressure range.

In an embodiment, the cooling method of the immersion cooling system of the present disclosure further includes steps of: decreasing the amount of the plurality of electronic devices 20 for decreasing the hot vapor g being received by the condenser 30 and decreasing the pressure in the cooling tank 3; utilizing the pressure balancing device 5 to vent the vapor in the pressure balancing device 5 to the cooling tank 3 and to be deflated for maintaining the pressure in the cooling tank 3 within a constant pressure range.

From the above descriptions, the present disclosure provides an immersion cooling system and a cooling method thereof. The cooling liquid in the server box and the cooling liquid in the storage part are merged together through the liquid connecting pipe to maintain the same liquid level. Thereby, the cooling liquid condensed in the storage part can naturally flow back to the server box, and no water pump or valve should be added for controlling the flow of the cooling liquid.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An immersion cooling system for a server cabinet, comprising:

a plurality of server boxes, each having a cooling liquid and comprising an electronic device immersed in the cooling liquid, wherein the electronic device of at least one of the plurality of server boxes generates a thermal energy during the operation of the electronic device so that a part of the cooling liquid evaporates into a hot vapor;

a cooling tank connected to the plurality of server boxes, and comprising:

a condenser connected to a vent hole of each of the plurality of server boxes, wherein the condenser condenses the hot vapor from the server box to form the cooling liquid; and a storage part connected to the condenser, wherein the storage part storages the cooling liquid from the condenser; and a plurality of liquid connecting pipes, each having a first end connected to a bottom portion of the storage part and a second end connected to a bottom portion of the corresponding server box;

wherein the cooling liquid in the storage part flows into each of the plurality of server boxes through each of the plurality of liquid connecting pipes, wherein the cooling liquid in the storage part and the cooling liquid in each of the plurality of server boxes are maintained in a same liquid level, wherein the condenser comprises a first condensing pipe, a second condensing pipe, a plurality of copper pipes, a hot water output pipe and a cooling water input pipe, each of the plurality of copper pipes has a first end and a second end, and each of the plurality of copper pipes is bent and wound, the first condensing pipe is connected to the first end of each of the plurality of copper pipes, and the second condensing pipe is connected to the second end of each of the plurality of copper pipes, and the first condensing pipe and the second condensing pipe are connected to the hot water output pipe and the cooling water input pipe, respectively, wherein cooling water is injected into the second condensing pipe through the cooling water input pipe, the cooling water flows into the plurality of copper pipes through the second condensing pipe, an outer wall of the copper pipe is cooled down by the flowing cooling water, the hot vapor from the server box condenses into the cooling liquid when the hot vapor contacts the outer wall of the copper pipe, wherein a heat energy lost from the hot vapor during the condensation process is conducted inside of the copper pipe to heat up the cooling water and turn it into hot water, and the hot water is vented through the first condensing pipe and the hot water output pipe.

2. The immersion cooling system according to claim 1, further comprising a pressure balancing device, wherein the pressure balancing device is connected to the cooling tank and is configured to balance the pressure in the cooling tank.

3. The immersion cooling system according to claim 2, wherein the pressure balancing device comprises a balloon or a bellow, and the balloon or the bellow regulates the pressure in the cooling tank through inflation or deflation.

4. The immersion cooling system according to claim 1, wherein the cooling liquid is a non-conductive liquid with a boiling point between 50° C. and 60° C.

5. The immersion cooling system according to claim 1, wherein the bottom portion of the storage part is higher than the bottom portion of each of the plurality of server boxes relative to the ground so the cooling liquid in the storage part flows into each of the plurality of server boxes through each of the plurality of liquid connecting pipes.

6. A cooling method of an immersion cooling system comprising steps of:
providing a cooling liquid, a plurality of server boxes, a cooling tank and a plurality of liquid connecting pipes, wherein a part of the cooling liquid is contained in the plurality of server boxes, and the other part of the cooling liquid is contained in the cooling tank, the cooling tank is connected to the plurality of server boxes and the plurality of liquid connecting pipes;
immersing a plurality of electronic devices in the cooling liquid in the plurality of server boxes, respectively, wherein a vapor space is formed in each of the plurality of server boxes above the cooling liquid, and the vapor space of each of the plurality of server boxes is connected to the cooling tank;
operating the electronic device of at least one of the plurality of server boxes, wherein the electronic device of at least one of the plurality of server boxes generates a-thermal energy during operation, which causes a part of the cooling liquid evaporates into #-hot vapor, and the hot vapor flows into the vapor space;
utilizing a condenser of the cooling tank to condense the hot vapor from the server box to form the cooling liquid, wherein the cooling liquid flows into a storage part of the cooling tank through a plurality of copper pipes of the condenser; and
utilizing the plurality of liquid connecting pipes to connect a bottom portion of the storage part and a bottom portion of each of the plurality of server boxes, and the cooling liquid in the storage part flowing into each of the plurality server boxes through each of the plurality of liquid connecting pipes,
wherein the cooling liquid in the storage part and the cooling liquid in each of the plurality of server boxes are maintained in a same liquid level,
wherein the condenser comprises a first condensing pipe, a second condensing pipe, a plurality of copper pipes, a hot water output pipe and a cooling water input pipe, each of the plurality of copper pipes has a first end and a second end, and each of the plurality of copper pipes is bent and wound, the first condensing pipe is connected to the first end of each of the plurality of copper pipes, and the second condensing pipe is connected to the second end of each of the plurality of copper pipes, and the first condensing pipe and the second condensing pipe are connected to the hot water output pipe and the cooling water input pipe, respectively,
wherein cooling water is injected into the second condensing pipe through the cooling water input pipe, the cooling water flows into the plurality of copper pipes through the second condensing pipe, an outer wall of the copper pipe is cooled down by the flowing cooling water, the hot vapor from the server box condenses into the cooling liquid when the hot vapor contacts the outer wall of the copper pipe, wherein a heat energy lost from the hot vapor during the condensation process is conducted inside of the copper pipe to heat up the cooling water and turn it into hot water, and the hot water is vented through the first condensing pipe and the hot water output pipe.

7. The cooling method according to claim 6, further comprising a step of providing a pressure balancing device, wherein the pressure balancing device is connected to the cooling tank and is configured to balance the pressure in the cooling tank.

8. The cooling method according to claim 7, further comprising steps of:
increasing an amount of the plurality of electronic devices for increasing the hot vapor being received by the condenser and increasing the pressure in the cooling tank; and
utilizing the pressure balancing device connected to the cooling tank to absorb the hot vapor in the cooling tank and to be inflated for maintaining the pressure in the cooling tank within a constant pressure range.

9. The cooling method according to claim 8, further comprising steps of:
decreasing the amount of the plurality of electronic devices for decreasing the hot vapor being received by the condenser and decreasing the pressure in the cooling tank; and
utilizing the pressure balancing device to vent the vapor in the pressure balancing device to the cooling tank and to be deflated for maintaining the pressure in the cooling tank within the constant pressure range.

10. The cooling method according to claim 6, further comprising a step of:
setting the bottom portion of the storage part to be higher than the bottom portion of each of the plurality of server boxes relative to a ground, and the cooling liquid in the storage part flowing into each of the plurality of server boxes through each of the plurality of liquid connecting pipes.

* * * * *